United States Patent

Klatt et al.

[19]

[11] Patent Number: 6,097,605
[45] Date of Patent: *Aug. 1, 2000

[54] CONTACTING UNIT FOR CARD-SHAPED SUPPORT ELEMENTS FOR ELECTRONIC COMPONENTS

[75] Inventors: Dieter Klatt, Wülfrath; Arnd Bäcker, Hellenthal, both of Germany

[73] Assignee: Stocko Metallwaren Fabriken Henkels und Sohn GmbH & Co., Germany

[ * ] Notice: This patent issued on a continued prosecution application filed under 37 CFR 1.53(d), and is subject to the twenty year patent term provisions of 35 U.S.C. 154(a)(2).

[21] Appl. No.: 08/755,957

[22] Filed: Nov. 25, 1996

[30] Foreign Application Priority Data

Nov. 25, 1995 [DE] Germany ........................ 295 18 707 U

[51] Int. Cl.$^7$ ........................................................ H05K 1/14
[52] U.S. Cl. ............................ 361/737; 361/796; 361/752; 439/946
[58] Field of Search ............................ 361/737, 725–727, 361/752, 796, 797; 439/946; 257/679; 235/492

[56] References Cited

U.S. PATENT DOCUMENTS

| | | |
|---|---|---|
| 2,952,810 | 9/1960 | Helton . |
| 5,043,562 | 8/1991 | Hautvast et al. . |
| 5,184,282 | 2/1993 | Kaneda et al. . |
| 5,290,174 | 3/1994 | Woratyla et al. . |
| 5,364,275 | 11/1994 | Ota et al. . |
| 5,608,607 | 3/1997 | Dittmer .................................. 361/686 |

FOREIGN PATENT DOCUMENTS

| | | |
|---|---|---|
| 0552078 | 7/1993 | European Pat. Off. . |
| 295 05 678 U | 7/1995 | Germany . |
| 295 06 344 U | 9/1995 | Germany . |
| 295 10 948 U | 10/1995 | Germany . |

*Primary Examiner*—Jayprakash N. Gandhi
*Attorney, Agent, or Firm*—Robert W. Becker & Associates

[57] ABSTRACT

A contacting unit for a card with electronic components has a housing with an insertion slot for receiving a card with electronic components. The housing has at least one lateral slot cutout for receiving a card with electronic components. A printed circuit board is positioned within the housing. The printed circuit board has contacting elements for the electronic components of the cards. The housing has a connector field at one lateral side thereof. The printed circuit board is connected to the connector field. The housing is designed so as to receive a plurality of cards in at least one plane of the housing in at least one arrangement including a stacked arrangement, a staggered arrangement, a side-by-side arrangement, an overlapping arrangement, an end-to-end arrangement, and a head-to-tail arrangement.

9 Claims, 5 Drawing Sheets

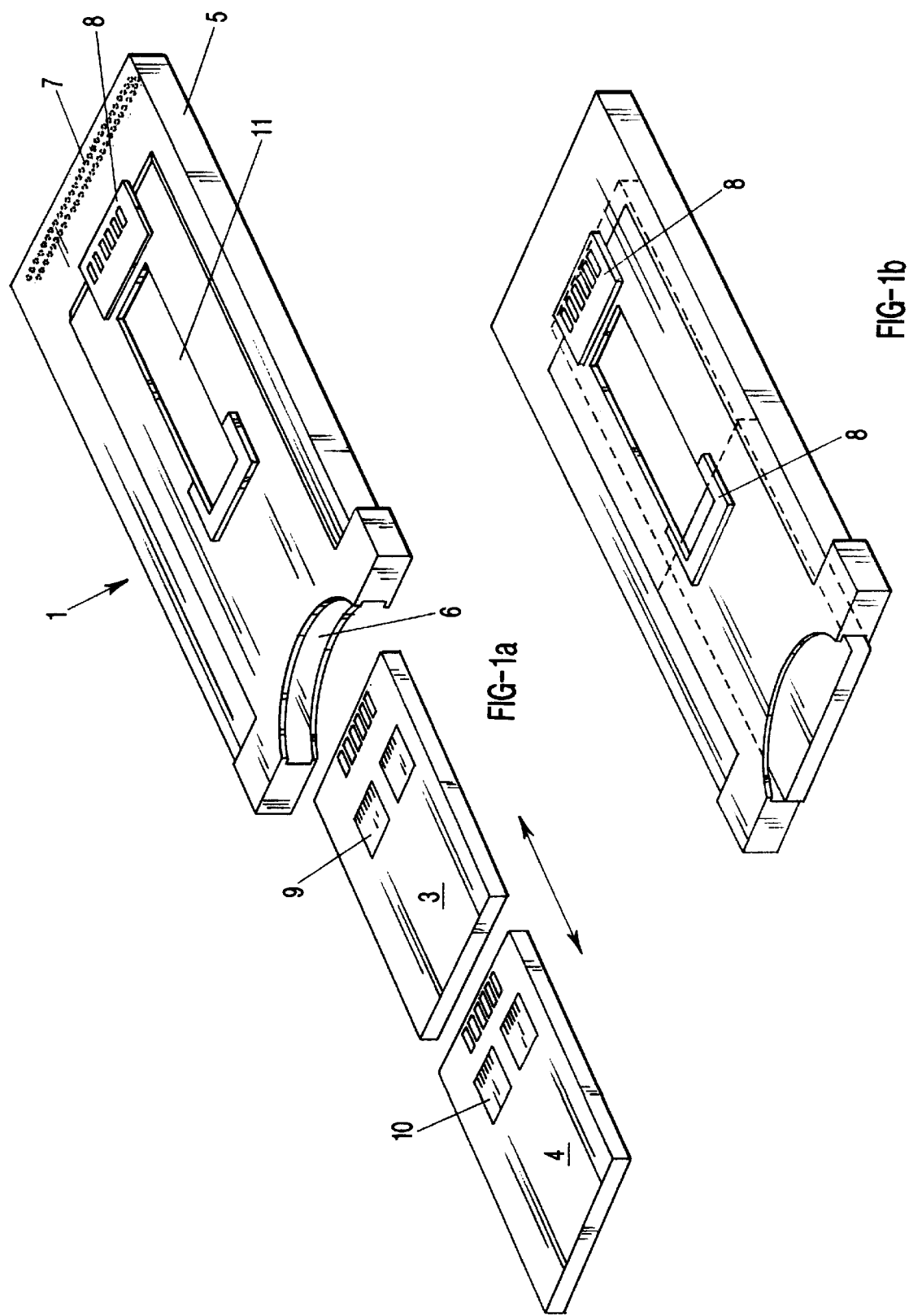

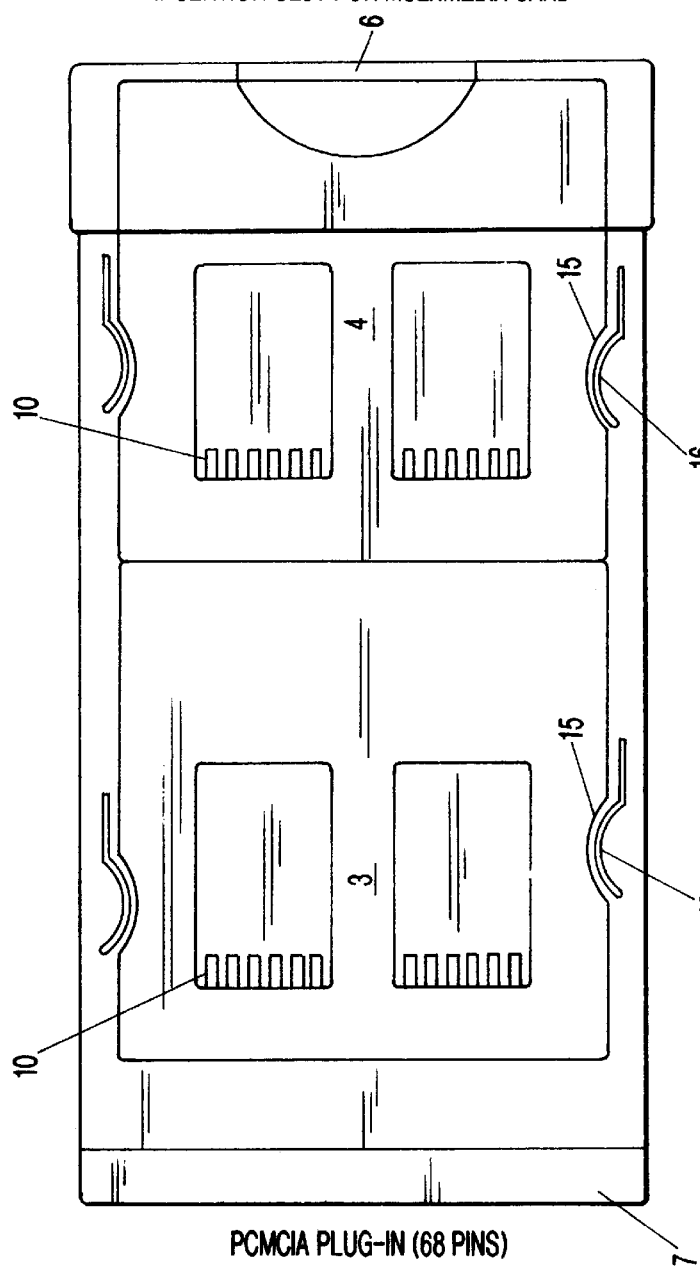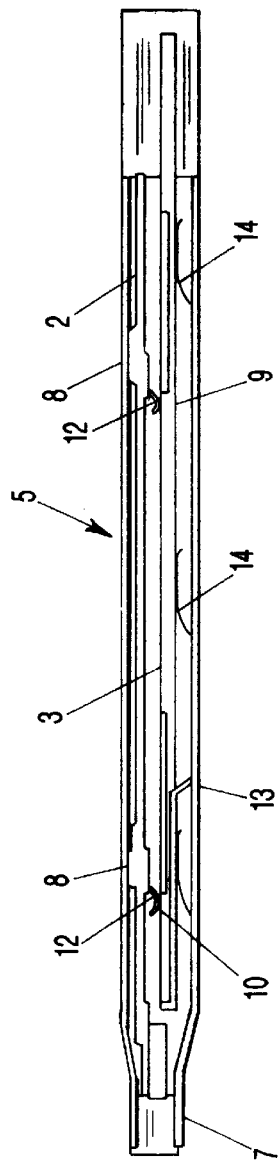
FIG-2a
FIG-2b

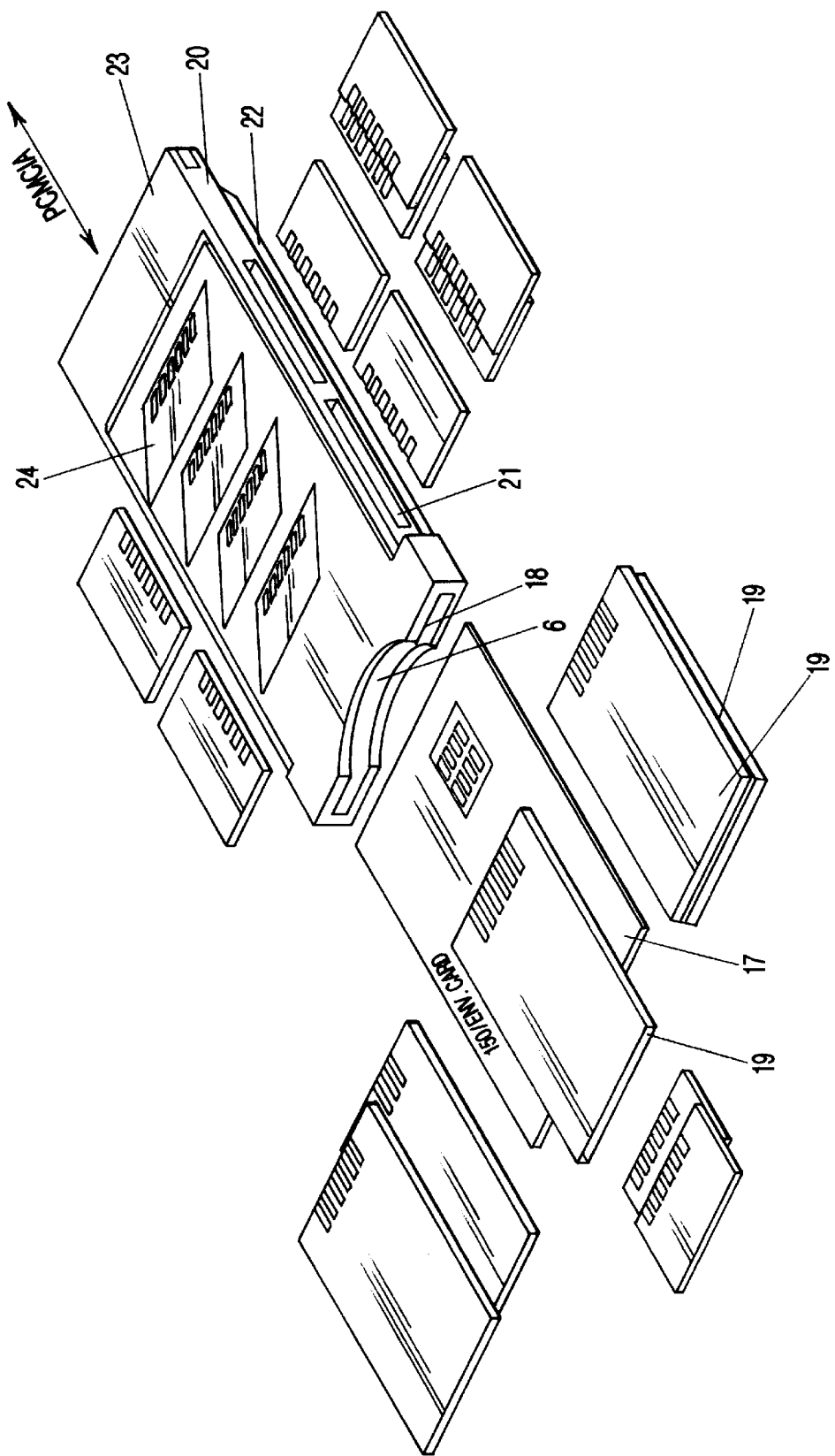

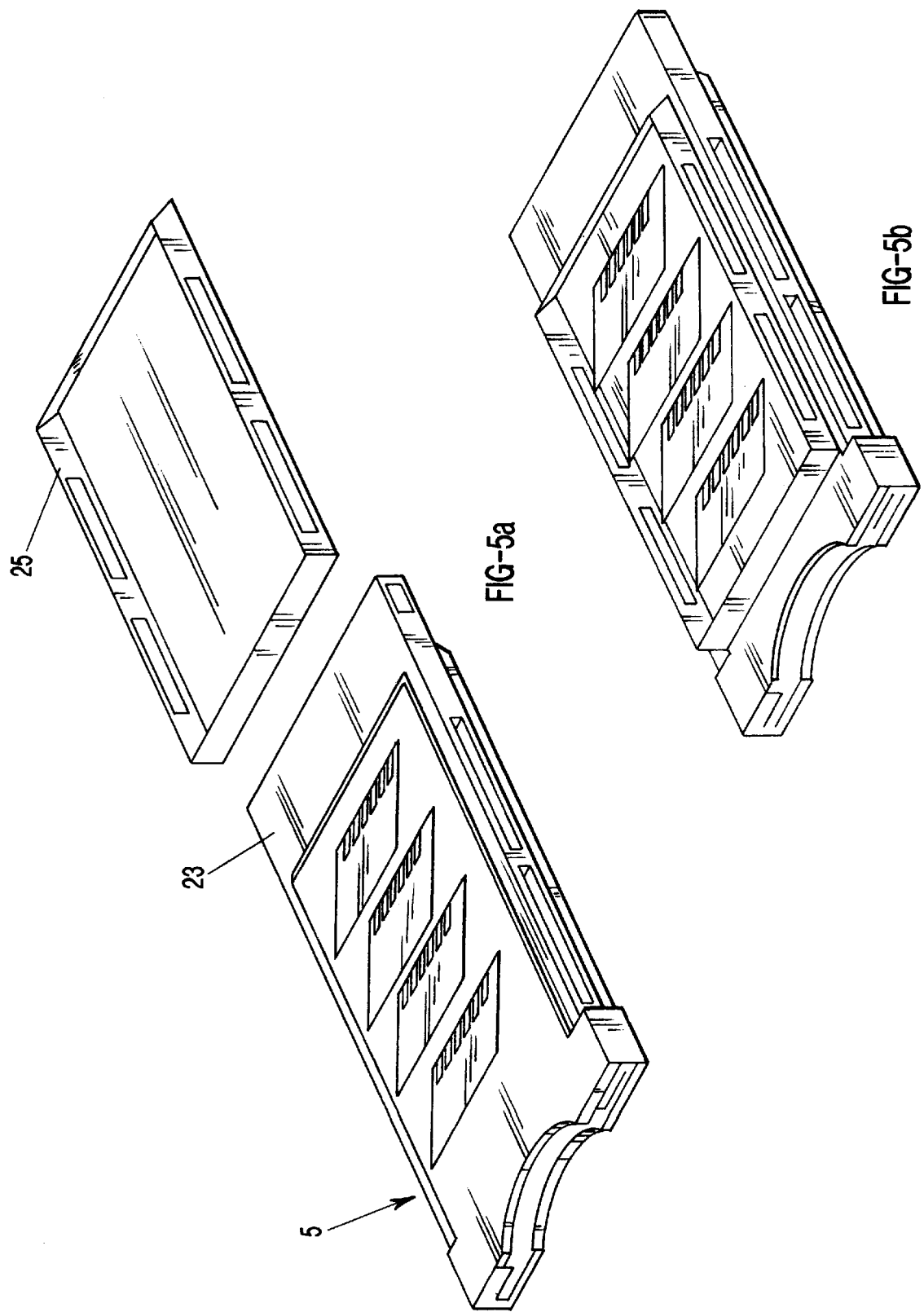

# CONTACTING UNIT FOR CARD-SHAPED SUPPORT ELEMENTS FOR ELECTRONIC COMPONENTS

BACKGROUND OF THE INVENTION

The present invention relates to a contacting unit for card-shaped support elements of electronic components with a housing comprising an insertion slot for the support elements (generally called cards) in which housing a printed circuit board is arranged which has contacting elements for the electronic components and is connected to a contact field, especially one embodied according to the PCMCIA standard, arranged at one side of the housing. The housing is provided laterally with a cutout for an insertion chip card.

In the field of computer technology multimedia applications have a steadily growing market share. Accordingly, conventional personal computers must be prepared for such applications which allow the user to process music, to view movies, to individualize video pictures with respective processing programs or to play games. A medium known in the art for retrofitting personal computers for such multimedia applications is the use of card-shaped support elements with electronic components, for example, multimedia cards (MMC) which comprise a semi conductor chip, for example, having 16, 64, 256 and more megabit.

Such card-shaped support elements have contact fields at their end faces and/or upper surfaces and are insertable into contacting units where they are electrically contacted and integrated into the data circuit of the personal computer. The contact fields for contacting a chip are also insertable into the contacting units that especially function as read units. Furthermore, combinations of such card systems are known whereby, for example, at the same time a PCMCIA and a chip card are inserted into a corresponding contacting unit. Known card-shaped support elements are especially embodied according to PCMCIA standard and comprise accordingly a standardized matrix-like connecting field and IC circuits of different design. Such cards can function as memory expansion cards, processing unit cards, modem cards, etc. They can be contacted in the contacting unit with a corresponding pin matrix and are inserted into the insertion slot of, for example, a personal computer for this purpose.

In the special multimedia application area, the chips of the multimedia cards are loaded with programs during manufacturing and, optionally, they are provided with single use write memories or reusable memory units. The multimedia card is a serial system and is thus stackable (like CD changers) for block memory systems. For example, packaged digital data are stored on multi media cards and are retrieved with a contact system with metallic surfaces without requiring movable parts. The MMC serves as a storage medium for software, dictionaries, encyclopedias, street maps, travel guides, games, music etc. and can be used in connection with PCs, hand-held electronic devices, organizers, car radios, notebook computers etc. which are provided with a reading device. The connection to the reading device is established via the aforementioned contacting unit.

The known contacting units can no longer fulfill the technical requirements for such specific applications. It is only suggested in the prior art to provide a PCMCIA card in the area facing away from the contact field with a cutout for a chip card whereby, however, this arrangement does not provide noteworthy variability (European Application 0 552 078 A1). According to German gebrauchsmuster 295 05 678.9 it is thus suggested to provide the disclosed contacting unit with a second (additional) insertion area in the form of a lateral slot for receiving a so-called plug-in-card so that with the contacting unit in the form of a PCMCIA card it is possible to introduce two additional chip cards into the reading device of the computer. However, this embodiment of a contacting unit also can provide only a limited range of applications.

It is therefore an object of the present invention to improve a contacting unit of the aforementioned kind such that a wide range of applications of card-shaped support elements with electronic components can be combined with one another, whereby especially functional combinations are desired which serve to provide safety means or to allow access, respectively, deny access in order to prevent unauthorized use. At the same time, the design of variable large memory structures should be possible with minimal economical and constructive expenditure.

SUMMARY OF THE INVENTION

The contacting unit for cards with a electronic components according to the present invention is primarily characterized by:

A housing;
The housing having an insertion slot for receiving a card with electronic components;
The housing having at least one slot cutout for receiving a card with electronic components;
A printed circuit board positioned within the housing;
The printed circuit board having contacting elements for the electronic components of the card;
The housing having a connector field at one lateral side thereof;
The printed circuit board connected to the connector field;
The housing designed so as to receive a plurality of the cards in at least one plane of the housing in at least one arrangement selected from the group consisting of a stacked arrangement, a staggered arrangement, a side-by-side arrangement, an overlapping arrangement, an end-to-end arrangement, and a head-to-tail arrangement.

Preferably, the cards have at least one surface contact field positioned at one of the sides of the card, the at least one surface contact field electrically connected via the contact elements to the connector field of the housing.

Advantageously, the insertion slot has a rectangular, widened portion for receiving differently combined cards within the housing.

Preferably, the arrangement includes one ISO 7816 chip card and at least one multimedia card.

The housing has a top side and a bottom side. Preferably the housing has slanted SIMM slots for receiving the cards, and the SIMM slots are located at least at one of the bottom side and the top side.

Advantageously, the contacting unit further comprises a slidable cover or a snap-on cover connected to the housing.

Expediently, the housing has opposed longitudinal sides and each longitudinal side has two slot cutouts for receiving cards in the form of multimedia half cards.

The housing has preferably an ejecting mechanism for retrieving the cards inserted into the housing.

In another preferred embodiment of the present invention, the housing has a window for retrieving the cards inserted into the housing.

The housing preferably comprises a locking mechanism for securing the cards.

According to the present invention, the contacting unit of the aforementioned kind has a housing for receiving and contacting a plurality, at least two, card-shaped support elements, which are arranged head-to-tail, side-by-side, staggered, stacked, and/or overlapping in one or more planes of the housing. This ensures that in a simple manner within the smallest possible space a large size storage medium is provided as is, for example, necessary for multimedia applications.

The card-shaped support elements (cards) for electronic components are embodied, as is known in the prior art, as ISO 7816 chip cards and have surface contact fields at the end faces which are connected via the contacting elements of the printed circuit board to the connector field, that is preferably in the form of a PCMCIA socket. It is expedient to interconnect the surface contact fields in a stacked arrangement of the cards in order to form a block memory system so that the connection to the printed circuit board, even for a combination of, for example, eight card-shaped support elements, only requires two contact locations.

Generally, the receiving means for card-shaped support elements in the contacting unit are embodied as slots or slot cutouts. In a suitable design of the invention, it is suggested to provide the insertion slot so as to be adapted to the dimensions of the ISO 7816 chip card with a rectangularly shaped widened portion so that the insertion slot allows for the insertion of cards (support elements) in various combinations. Especially favorable is the combination of an ISO 7816 chip card with one or more multimedia cards in a head-to-tail arrangement, side-by-side arrangement, in a staggered arrangement, in a stacked arrangement, and/or in a partly overlapping arrangement in one or two planes. At the top side or bottom side of the contacting unit (i.e., of its housing), slanted slots according to the SIMM technology are provided as receiving means. This allow for a great packing density of the card-shaped support elements within the contacting unit. Advantageously, the slanted slots can be pivoted against a spring force by a snap-on or slidable cover into the plane of the housing and in this manner, while ensuring a minimal constructive size of the contacting unit, they are integrated and protected. On opposed narrow longitudinal sides of the contacting unit at least one, preferably two, slot cutouts with corresponding inner contact fields are provided for receiving multimedia half-cards.

The inventive contacting unit advantageously allows also the use of a plurality of exchangeable media, for example, when the contacting unit is used within a notebook computer and the provided electrical network supply is not to be interrupted. For example, into the insertion slot at the end face, an ISO 7816 chip card or a similar card can be inserted for authorizing access of a user, whereby a multimedia card or two smaller multimedia cards in half card design can be used as exchangeable data carriers. In the arrangement of a plurality of multimedia cards coaxially head-to-tail in the same plane according to an expedient embodiment of the invention, it is suggested to provide a window in the housing of the contacting unit via which the user can remove (retrieve) the inserted card-shaped support elements. In the alternative, it is also possible to provide an ejecting mechanism.

In order to secure the card-shaped support elements with electronic components within the housing of the contacting unit, according to an expedient embodiment of the invention it is suggested to arranged within the housing for each receiving means (slot) a locking mechanism which cooperates with a correspondingly embodied card-shaped support element based on a projection/recess design and which is expediently elastic in order to allow for releasability of the locking mechanism. Preferably, the card-shaped support element is provided at opposite sides with recesses engaged by securing springs of the locking mechanism connected to the housing in a detachable (releasable manner).

With the inventive contacting unit the basic idea of a multifunctional chip card reader is realized in which a plurality of chip cards can be arranged in different positions such that future applications with respect to authorizing access, large memory capability in the area of semiconductor technology, processor cards etc. can be used as desired by the user. Due to the combination of the different card-shaped support elements in different shapes and geometric embodiments, an application-based use is possible which is made possible by the contacting unit in that a plurality of multimedia cards can be integrated and read.

BRIEF DESCRIPTION OF THE DRAWINGS

The object and advantages of the present invention will appear more clearly from the following specification in conjunction with the accompanying drawings, in which:

FIG. 1a shows in a perspective view a contacting unit in an embodiment as a multimedia card reader with cards removed;

FIG. 1b shows the card reader of FIG. 1a with the cards inserted;

FIG. 2a is a plan view of the multimedia card reader of FIG. 1 without cover, allowing a view of the interior of the housing and also showing a respective side view;

FIG. 2b is a side view of the device of FIG. 2a;

FIG. 3 shows the multi media card reader of FIG. 1 with a schematic illustration of different receiving means for card-shaped support elements;

FIG. 5a shows perspectively the contacting unit with detached cover; and

FIG. 5b shows the contacting unit of FIG. 5a with attached cover.

DESCRIPTION OF PREFERRED EMBODIMENTS

Figure 4:
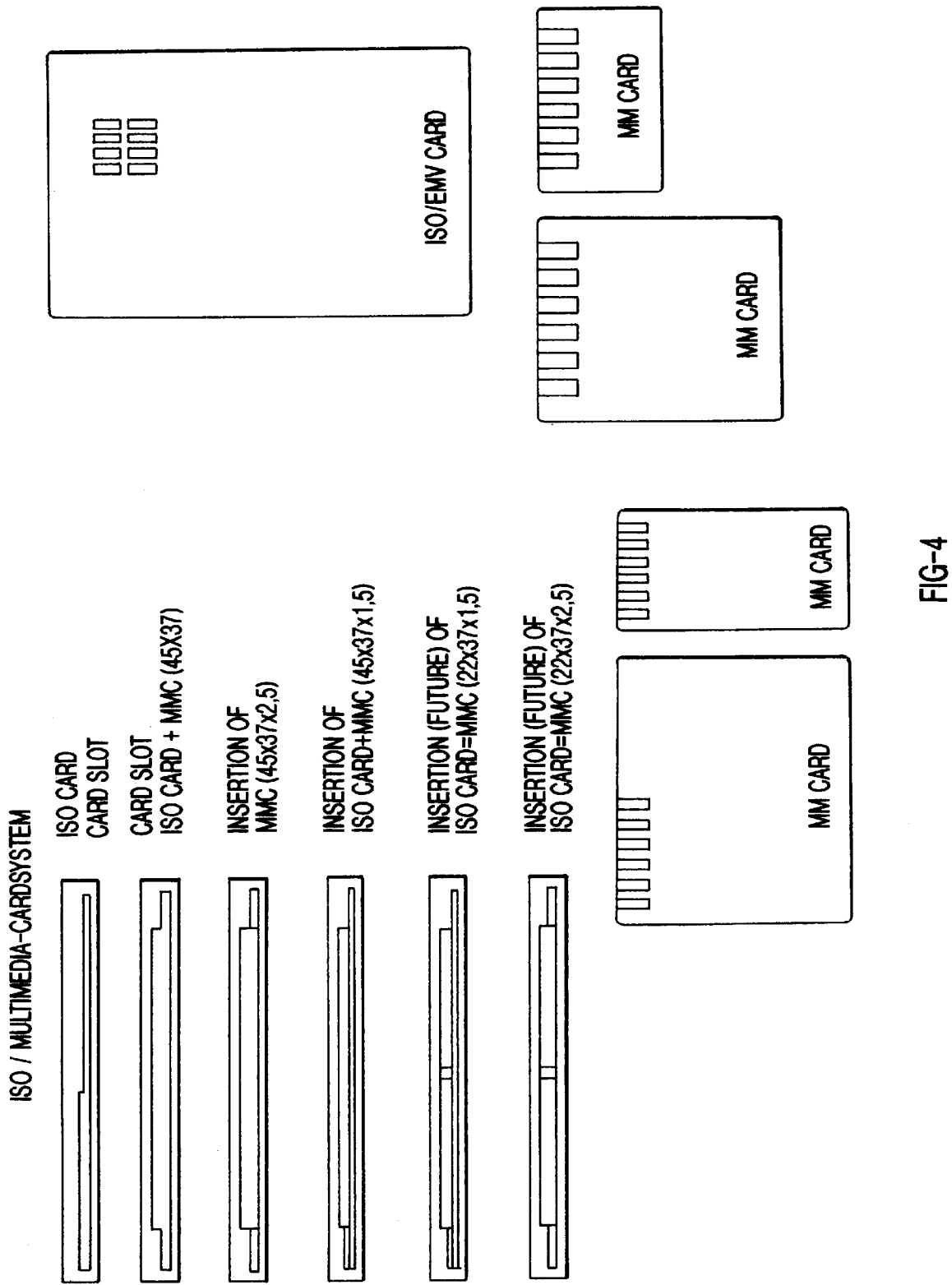
FIG. 4 shows a schematic overview of the different designs of slot receptacles for different multi media cards.

The present invention will now be described in detail with the aid of several specific embodiments utilizing FIGS. 1a through 5b.

The contacting unit 1 of the embodiment represented in FIGS. 1a and 1b comprises a printed circuit board 2 that can be seen in FIG. 2b which serves to contact card-shaped support elements in the form of two multimedia cards 3, 4 with electronic components. The printed circuit board 2 is arranged within a housing 5 which on one side is provided with a slot-shaped receptacle (insertion slot) 6 for the card-shaped support elements 3 and 4 and at the opposite side is provided with connector field in the form of a PCMCIA plug 7 for connecting the contacting unit 1 to, for example, a notebook computer. The multimedia cards 3 and 4 can be inserted and retracted in the direction of the double arrow of FIG. 1 into and from the contacting unit 1 with PCMCIA card. In the inserted state, which is shown in FIG. 1b, a six-pole contact bank, extending from the component side through the printed circuit board 2, contacts as a contacting element the respective multimedia card 4 so that with the corresponding six-pole surface contact field 9, 10 the electrical contacting of the electronic component of the multimedia card with the contacting unit is realized. Thus, the two chip cards can be processed via the PCMCIA card when the latter is inserted into the insertion slot of an electronic processing device and connected via the PCMCIA plug 7 to corresponding contacts. Applications can be envisioned especially in the area of multimedia processing but also in the field of communication, banking etc.

The housing 5 of the contacting unit 1 comprises, for facilitating operation, a part circular recess at the slot-shaped receptacle 6 which allows the user to remove the second inserted multimedia card 4 from the contacting unit 1. In order to be able to retrieve the inserted multimedia card 3, the upper side of the housing 5 is provided with a window 11 through which the user can insert his thumb to thereby engage the multi-media card 3 positioned thereunder and to push it through the insertion slot receptacle 6 out of the housing 5.

FIGS. 2a and 2b of the drawing show in two representations a view of the interior of the contacting unit 1, whereby it can be seen that the printed circuit board 2 with its contacting elements 8 is in contact via downwardly extending contact springs 12 with the surface contact fields 9,10 of the multimedia cards 3, 4. The spring action ensures safe contacting by providing a respective pressure. Pressure springs 14 arranged below the multimedia cards 3, 4 within the housing 5 improve securing and contacting of the cards in the housing 5. Furthermore, the embodiment of FIG. 2b shows an alternative to the window 11 of the embodiment of FIGS. 1a and 1b in the form of an ejection lever 13 provided at the housing 5 with which the inner multimedia card 3 can also be pushed out of the housing 5.

In order to secure the card-shaped support elements inserted into the housing 5 of the contacting unit 1, a locking mechanism in the form of a snap connection is provided for each card. In FIG. 2a a snap connection is shown that includes recesses 15 provided at each multimedia card 3, 4 on opposite sides. In the inserted state securing springs 16, connected laterally to the housing 5, engage the recesses 15 in order to thus provide the snap connection. The snap connection is releasable by elastically bending outwardly the securing springs 16 for removing the cards 3 and 4.

FIG. 3 of the drawing shows different variants of the card-shaped support elements (cards) for insertion into the housing slots whereby in a non-represented manner inwardly positioned contacting means are provided, in the form of contacting elements or contacting fields connected to the printed circuit board 2, optionally also by connecting printed circuit boards to one another in order to create a block.

For insertion at the front end, the insertion slot 6 is provided with a wide base slot for an ISO 7816 chip card 17. Above the base slot a rectangular, widened portion is provided that matches the size of the multi media card 19. An insertion of the two stack ed cards 17 and 19 into the contacting unit 1 is thus possible. Alternatively, two multimedia cards can be stacked or arranged in a staggered arrangement relative to one another, as shown to the right and left in FIG. 3, and can be inserted such. Further alternative combinations are represented in FIG. 3 and need not be explained in more detail.

The housing 5 of the contacting unit is furthermore provided with slot-shaped cutouts 21, 22 for multimedia cards in half card size which are located at two oppositely arranged narrow sides 20 whereby, of course, inwardly positioned contacting means are also provided. Alternative embodiments are also shown in the drawing.

Furthermore, at the top side 23 of the housing 5 four card receiving means 24 are arranged in a row which allow for a slanted introduction of multimedia cards according to the known SIMM technology.

For all of the card receiving means are in the form of slots provided at the housing 5 which are adapted in their size to the respective cards. FIG. 4 of the drawing shows different possibilities of embodying the insertion slots of the card receiving means for the respective cards and their dimensions as well as different shapes and formats of multimedia cards which can be used with the inventive contacting unit.

In the embodiment represented in FIG. 5a the top side 23 of the housing 5 is provided with a slidable cover 25 which in its simplest embodiment only serves to fold the slanted receiving means 24 into the plane of the top side 23 against a spring force in order to protect the multimedia cards. This is illustrated in FIG. 5b in which the operative state is shown. It is furthermore indicated that the cover 25 can also be used to provide card receiving means (slots) with corresponding contacting means for broadening the range of applications of the contacting unit even farther.

The present invention is, of course, in no way restricted to the specific disclosure of the specification and drawings, but also encompasses any modifications within the scope of the appended claims.

What we claim is:

1. A contacting unit comprising:

a housing;

said housing having an insertion slot consisting an ISO card base slot and a rectangular multi-media card slot portion located above said ISO card base slot;

said rectangular multi-media card slot portion designed to receive a single multimedia card or multiple multimedia cards in a stacked arrangement or a staggered arrangement;

said housing having at least one slot cutout for receiving a card with electronic components;

a printed circuit board positioned within said housing;

said printed circuit board having electrical contacting elements for electrically contacting an ISO card and at least one multi-media card received in said insertion slot;

said housing having a connector field at one lateral side thereof;

said printed circuit board connected to said connector field;

said housing designed to receive in said at least one slot cutout a plurality of the cards with electronic components in at least one plane of said housing in at least one arrangement selected from the group consisting of a stacked arrangement, a staggered arrangement, a side-by-side arrangement, an overlapping arrangement, an end-to-end arrangement, and a head-to-tail arrangement.

2. A contacting unit according to claim 1, wherein said contacting elements are designed to electrically connect at least one surface contact field positioned at one of the sides of the card to said connector field of said housing.

3. A contacting unit according to claim 1, wherein said housing has a top side and a bottom side and wherein said housing has slanted SIMM slots for receiving the cards, said SIMM slots located at least at one of said bottom side and said top side.

4. A contacting unit according to claim 3, further comprising a slidable cover connected to said housing.

5. A contacting unit according to claim 3, further comprising a snap-on cover connected to said housing.

6. A contacting unit according to claim 1, wherein said housing has opposed longitudinal sides and wherein each of said longitudinal sides has two of said slot cutouts for receiving cards in the form of multimedia half-cards.

7. A contacting unit according to claim 1, wherein said housing has an ejecting mechanism for retrieving the cards inserted into said housing.

8. A contacting unit according to claim 1, wherein said housing has a window for retrieving the cards inserted into said housing.

9. A contacting unit according to claim 1, wherein said housing comprises a locking mechanism for securing the cards.

* * * * *